United States Patent
Lo et al.

(10) Patent No.: US 8,451,641 B2
(45) Date of Patent: *May 28, 2013

(54) MEMORY ARRAY NO COMMON SOURCE REGION AND METHOD OF FABRICATING THE SAME

(75) Inventors: Chun-Yuan Lo, Hsinchu (TW); Cheng-Ming Yih, Hsinchu (TW); Wen-Pin Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/549,272

(22) Filed: Jul. 13, 2012

(65) Prior Publication Data

US 2012/0273842 A1    Nov. 1, 2012

Related U.S. Application Data

(60) Division of application No. 13/045,153, filed on Mar. 10, 2011, now Pat. No. 8,243,489, which is a continuation of application No. 12/366,910, filed on Feb. 6, 2009, now Pat. No. 7,924,591.

(51) Int. Cl.
*G11C 7/00* (2006.01)

(52) U.S. Cl.
USPC ...... 365/53; 365/63; 365/185.05; 365/185.25

(58) Field of Classification Search
USPC .................... 365/53, 63, 185.05, 185.25
See application file for complete search history.

(56) References Cited

U.S. PATENT DOCUMENTS

| | | | |
|---|---|---|---|
| 7,924,591 B2 * | 4/2011 | Lo et al. | 365/53 |
| 2007/0166918 A1 * | 7/2007 | Oh et al. | 438/257 |

FOREIGN PATENT DOCUMENTS

CN    101005081    7/2007

OTHER PUBLICATIONS

"First Office Action of China Counterpart Application", issued on Jul. 2, 2012, p.1-p.7, in which the listed reference was cited.

* cited by examiner

*Primary Examiner* — Hoai V Ho
(74) *Attorney, Agent, or Firm* — J.C. Patents

(57) ABSTRACT

A memory array including a plurality of memory cells, a plurality of word lines, a dummy word line, and a plug is provided. Each word line is coupled to corresponding memory cells. A dummy word line is directly adjacent to an outmost word line of the plurality of word lines. The plug is located between the dummy word line and the outmost word line.

12 Claims, 3 Drawing Sheets

MEMORY ARRAY NO COMMON SOURCE REGION AND METHOD OF FABRICATING THE SAME

CROSS-REFERENCES TO RELATED APPLICATION

This is a divisional application of and claims the priority benefit of U.S. application Ser. No. 13/045,153, filed on Mar. 10, 2011, U.S. Pat. No. 8,243,489 B2. The prior U.S. application Ser. No. 13/045,153 is a continuation application of and claims the priority benefit of U.S. application Ser. No. 12/366,910, filed on Feb. 6, 2009, U.S. Pat. No. 7,924,591. The entirety of each of the above-mentioned patent applications is hereby incorporated by reference herein and made a part of this specification.

CROSS-REFERENCE TO RELATED APPLICATION

This is a divisional application of and claims the priority benefit of U.S. application Ser. No. 13/045,153, filed on Mar. 10, 2011. The prior U.S. application Ser. No. 13/045,153 is a continuation application of and claims the priority benefit of U.S. application Ser. No. 12/366,910, filed on Feb. 6, 2009, U.S. Pat. No. 7,924,591. The entirety of each of the above-mentioned patent applications is hereby incorporated by reference herein and made a part of this specification.

BACKGROUND OF THE INVENTION

1. Field of Invention

The present invention relates to a semiconductor device and method of fabricating the same. More particularly, the present invention relates to a memory device and method of fabricating the same.

2. Description of Related Art

Non-volatile memory is currently used inside many types of electronic devices for holding structural data, programming data and other randomly access transient data. One type of non-volatile memory that can be repeatedly access is called flash memory. In fact, flash memory is an electrically erasable programmable read only memory (EEPROM) device that allows multiple data writing, reading and erasing operations. In addition, the stored data will be retained even after power to the device is removed. With these advantages, it has been broadly applied in personal computer and electronic equipment.

Conventionally, the memory device having a plurality of memory cell arranged in an array is constructed by several word lines parallel to each other. Furthermore, as shown in FIG. 3, at the boundary of the memory region where the functional word lines 302a are located, at least one dummy word line 302b is disposed directly aside the functional word lines 302a for the purpose of increasing the exposure uniformity of the lithography process. However, the existence of the dummy word line 302b aside the functional word lines 302a in the memory region would lead to coupling effect between the dummy word line 302b and the nearest functional word line 302a'. the coupling effect between the dummy word line 302b and the nearest functional word line 302a' leads to differentiating the performance of the nearest functional word line 302a' from the performance of other functional word lines 302a in the memory region. Therefore, the performances of the memory cells in the memory are not equivalent.

SUMMARY OF THE INVENTION

Accordingly, at least one objective of the present invention is to provide a memory device structure capable of decreasing the coupling effect between the dummy word line and the word line.

At least another objective of the present invention is to provide a memory device structure capable of overcoming the leakage during the program operation and the read operation.

A memory array including a plurality of memory cells, a plurality of word lines, a dummy word line, and a plug is provided. Each word line is coupled to corresponding memory cells. A dummy word line is directly adjacent to an outmost word line of the plurality of word lines. The plug is located between the dummy word line and the outmost word line.

A method of fabricating a memory array is further provided. A plurality of memory cells is formed. A plurality of first plugs is formed. A plurality of word lines and a dummy word line are formed. Each word line is coupled to corresponding memory cells. The dummy word line is directly adjacent to an outmost word line of the plurality of word lines. The step of forming a plurality of memory cells includes forming a plurality of first conductive regions disposed only on one side of the dummy word line, and the plurality of first plugs is located between the dummy word line and the outmost word line.

In the present invention, since the space between the dummy word line/dummy gate structure and the nearest functional word line/stacked gate structure is enlarged and the shielding plug can be a metal shielding to isolate the nearest functional word line from being voltage coupling with the dummy word line, the coupling effect between the dummy word line/dummy gate structure and the nearest functional word line/stacked gate structure is decrease Therefore, the erase threshold voltage distribution of the memory cells in the memory device is tighten without being affected by the dummy word line. Furthermore, because there is no common source region/self-aligned source region around the dummy word line, the leakage problem during the read operation and the program operation can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
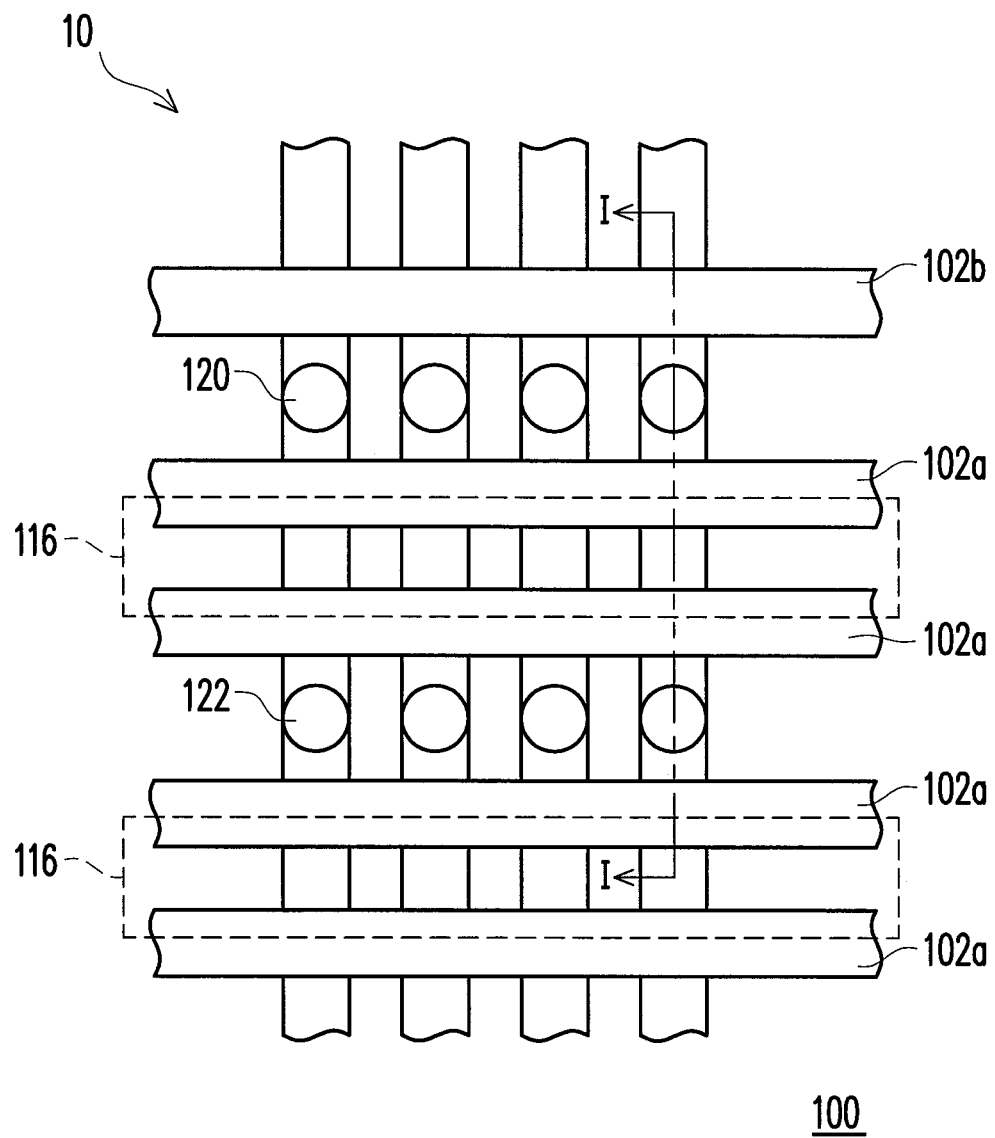
FIG. 1 is a top view showing a memory device according to a one embodiment of the invention.
Figure 2:
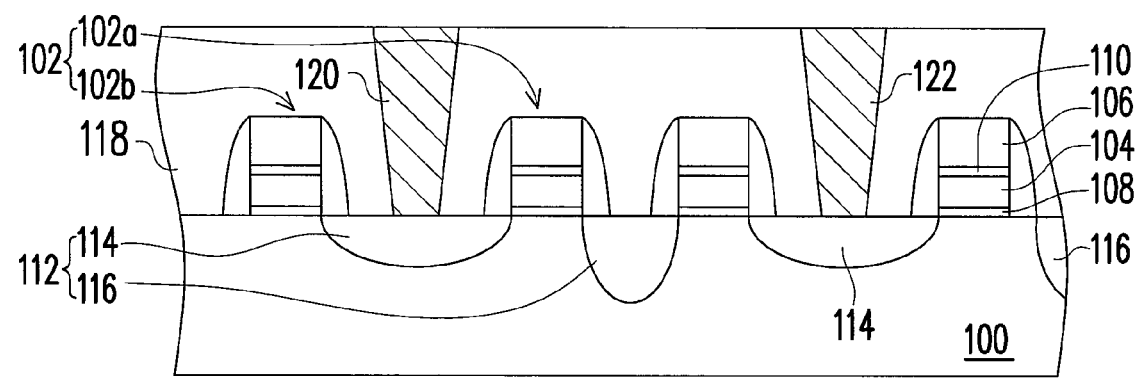
FIG. 2 is a cross-sectional view along line I-I in FIG. 1.
Figure 3:
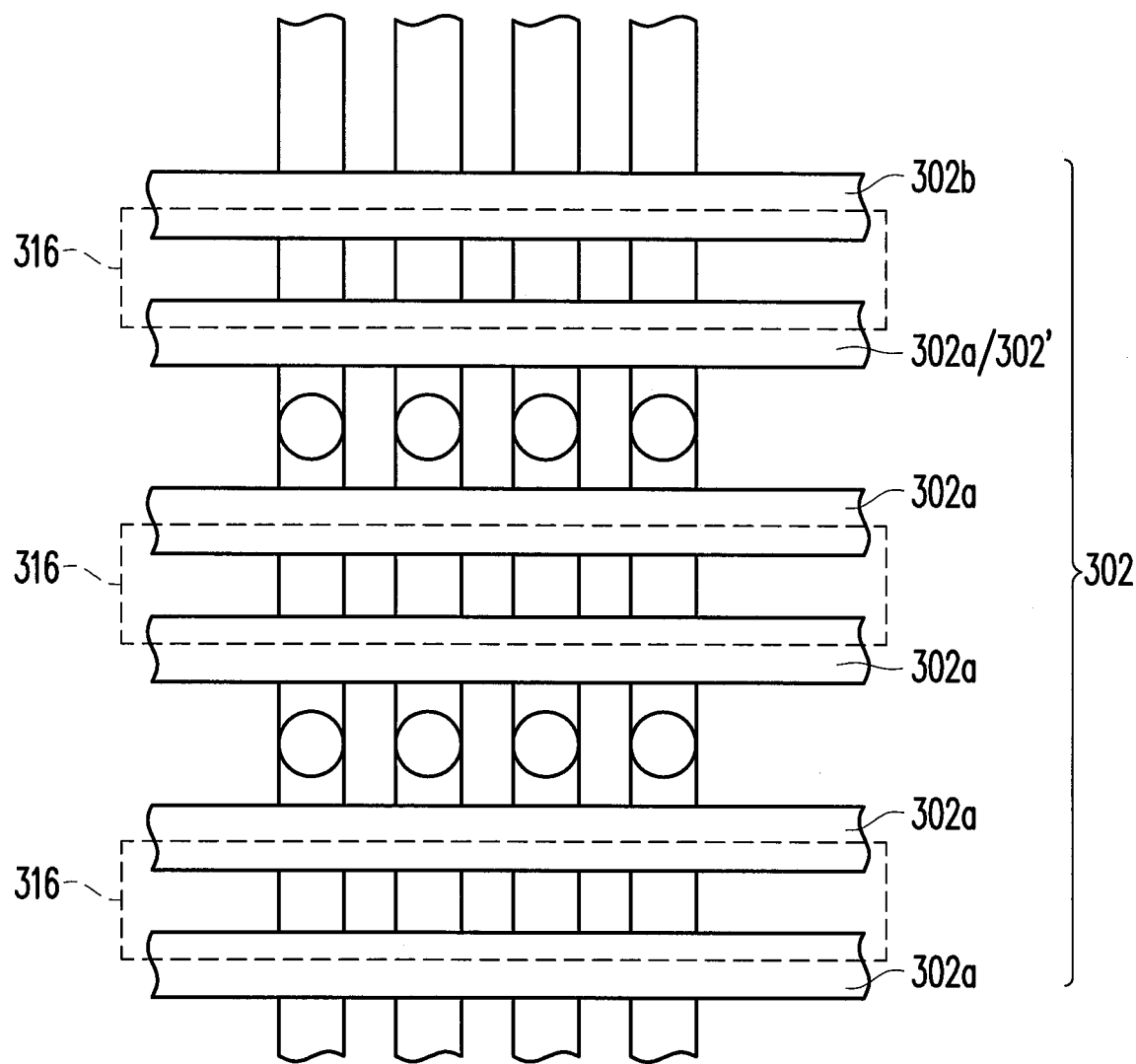
FIG. 3 is a top view showing a conventional memory device.

FIG. 1 is a top view showing a memory device according to a one embodiment of the invention. FIG. 2 is a cross-sectional view along line I-I in FIG. 1. As shown in FIG. 1 and FIG. 2, a memory device 10 is provided. In the memory device 10, a plurality of memory cells is arranged as an array. The memory cell can be, for example but not limited to, a multi-level cell for storing multiple bit data. The memory device 10 mainly comprises a substrate 100. The substrate 100 can be, for example but not limited to, a silicon substrate with a first conductive type. Alternatively, the substrate 100 can be a substrate with a shallow well (not shown) having the first conductive type. Moreover, a plurality of conductive lines 102a disposed on the substrate 100 and the conductive lines 102a are parallel to each other. The conductive lines 102a can be, for example but not limited to, word lines. It should be noticed that there are at least one semidetached conductive line 102b disposed aside the conductive lines 102a. Also, the semidetached conductive line 102b is disposed at a periphery of the group of the conductive lines 102a. On the other words, the semidetached conductive line 102b is directly adjacent to the outmost conductive line of the plurality of the conductive lines 102a. The semidetached conductive line 102b can be, for example but not limited to, dummy word line. Furthermore, the conductive lines 102a electrically couple to the memory cells respectively.

Moreover, each of the conductive lines 102a comprises a data storage element. The data storage element mentioned above can be, for example but not limited to, a floating gate or a charge trapping dielectric layer. In one embodiment, as shown in FIG. 2, each of the conductive lines 102a can be, for example but not limited to, a stacked gate structure having a floating gate 104 and a control gate 106 located over the floating gate 104. Also, the semidetached conductive line 102b can be formed together with the conductive lines 102a. Accordingly, the semidetached conductive line 102b/dummy gate structure can be, for example, the stacked gate structure as same as the conductive lines 102a. Further, the floating gate 104 is isolated from the substrate 100 by a tunneling dielectric layer 108 and is further isolated from the control gate 106 by an inter-gate dielectric layer 110. The tunneling dielectric layer 108 can be, for example but not limited to, made from silicon oxide by thermal oxidation. Also, the inter-gate dielectric layer 110 can be, for example but not limited to, an oxide/nitride/oxide composite layer, an oxide/nitride composite layer or a silicon oxide layer formed, for example, by carrying out a low-pressure chemical vapor deposition (LPCVD). Moreover, the floating gate 104 and the control gate 106 can be, for example but not limited to, made from doped polysilicon by carrying out a chemical vapor deposition to form an undoped polysilicon layer and implanting ions into the undoped polysilicon layer. Alternatively, the floating gate 104 and the control gate 106 can be fabricated in an in-situ ion doping and chemical vapor deposition process.

As shown in FIG. 2, a plurality of conductive regions 112 is disposed in the substrate and between the conductive lines 102a respectively and between the semidetached conductive line 102b and the plurality of the conductive lines 102a. Notably, the conductive regions 112 can be diffusion regions including several drain regions 114 and several source region 116. Also, the drain regions 114 and the source regions 116 are alternatively arranged between the conductive lines 102. In addition, only one side of the semidetached conductive line 102b in the substrate 100 and between the semidetached conductive line 102b and the plurality of the conductive lines 102a is arranged with one of the conductive regions 112, which can be the drain region 114. Moreover, the conductive regions 112 can be, for example, formed by implanting process. More specifically, the source regions 116 can be, for example, self-aligned source regions. Additionally, the conductive regions 112 have a second conductive type. The first conductive type is different from the second conductive type. It should be noticed that none of the self-aligned source regions 116 is arranged directly around the semidetached conductive line 102b.

As shown in FIG. 2, an inter-layer dielectric layer 118 is formed to cover the conductive lines 102a, the semidetached conductive line 102b and the substrate 100. The inter-layer dielectric layer 118 is fabricated using borophosphosilicate glass (BPSG) or phosphosilicate glass (PSG) in a chemical vapor deposition, for example. The inter-layer dielectric layer 118 can further be, for example, planarized by back etching or performing a chemical-mechanical polishing process. Further, at least one shielding plug 120 penetrates through the inter-layer dielectric layer 118 and is located on the substrate 100. It should be noticed that the shielding plug 120 is immediately adjacent to the semidetached conductive line 102b and is located between the semidetached conductive line 102b and the plurality of conductive lines 102a. Moreover, the shielding plug 120 is electrically connected to the conductive region 114 located between the semidetached conductive line 102b and the group of the conductive lines 102a. Also, the shielding plug 120 can be, for example but not limited to, made of conductive material such as tungsten. In addition, there are several contact plugs 122 located within the inter-layer dielectric layer 118 and electrically connected to the drain regions 114 between the conductive lines 102a respectively. For example but not limited to, the shielding plug 120 can be formed together with the contact plugs 122 in inter-layer dielectric layer 118 at the same manufacturing step.

In the present invention, since the semidetached conductive line 102b/dummy gate structure is pull away from the nearest conductive line 102a by a shielding plug 120, the space between the semidetached conductive line 102b and the nearest conductive line 102a is enlarged. Furthermore, the shielding plug 120 can be a metal shielding to isolate the nearest conductive line 102a from being voltage coupling with the semidetached conductive line 102b. Accordingly, the operation environments of the conductive lines are similar to each other and the performances of the conductive lines are more equivalent.

Additionally, no self-aligned source region is disposed directly around the semidetached conductive line 102b. As shown in FIG. 1, it is clear that the semidetached conductive line 102b is separated from the nearest conductive line 102a by the shielding plug 120 and there is no self-aligned source regions 116 directly around semidetached conductive line 102b, Accordingly, the coupling effect between the gate in the semidetached conductive line 102b and the gate in the nearest conductive line 102a is decreased. Therefore, the erase threshold voltage of the conductive line close to the semidetached conductive line would not be affected by the coupling effect. Thus, the erase threshold voltage distribution of the memory cells in the memory device will be tighten.

Furthermore, because there is no source region, such as self-aligned source region, directly around the semidetached conductive line 102b, no current from self-aligned source region would leak through the semidetached conductive line 102b. Thus, the leakage problem during the read operation and the program operation of the memory device can be overcome. Therefore, the programming ability of the memory device is enhanced. Moreover, since the leakage of the memory cells in the memory devices is suppressed and the erase threshold voltage distribution is tighten, the read judgment window is enlarged.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory array, comprising:
   a plurality of memory cells;
   a plurality of word lines, each word line coupled to corresponding memory cells;
   a dummy word line directly adjacent to an outmost word line of the plurality of word lines; and
   a first plug located between the dummy word line and the outmost word line of the corresponding memory cells, wherein no first conductive region is disposed on one side of the dummy word line far from the outmost word line.

2. The memory array of claim 1, wherein the first conductive region is a source region.

3. The memory array of claim 1 further comprising a plurality of second conductive regions disposed between the word lines.

4. The memory array of claim 3, wherein the second conductive regions comprise a plurality of drain regions and a plurality of source regions and the drain regions and the source regions are alternatively arranged between the word lines.

5. The memory array of claim 4 further comprising a plurality of second plugs located on the plurality of drain regions and electrically connected to the plurality of drain regions.

6. The memory array of claim 1, wherein a plurality of drain regions and a plurality of source regions are alternatively arranged between the dummy word line and the plurality of word lines.

7. The memory array of claim 6, wherein the first plug located in one of the plurality of drain regions between the dummy word line and the outmost word line of the corresponding memory cells.

8. A method of fabricating a memory array, comprising:
   forming a plurality of memory cells;
   forming a plurality of first plugs; and
   forming a plurality of word lines and a dummy word line, each word line coupled to corresponding memory cells and the dummy word line directly adjacent to an outmost word line of the plurality of word lines,
   wherein the step of forming a plurality of memory cells includes forming a plurality of first conductive regions disposed only on one side of the dummy word line, and the plurality of first plugs is located between the dummy word line and the outmost word line, and no first conductive region is formed on one side of the dummy word line far from the outmost word line.

9. The memory array of claim 8, wherein the first conductive regions are source regions.

10. The method of claim 8 further comprising: forming a plurality of second conductive regions between the word lines.

11. The method of claim 10, wherein the second conductive regions comprise a plurality of drain regions and a plurality of source regions and the drain regions and the source regions are alternatively arranged between the word lines.

12. The method of claim 11 further comprising forming a plurality of second plugs on the drain regions and electrically connected to the drain regions.

* * * * *